(12) United States Patent
Bury et al.

(10) Patent No.: US 9,788,450 B2
(45) Date of Patent: Oct. 10, 2017

(54) COMPONENT ASSEMBLY SYSTEM

(71) Applicant: Phoenix Contact GmbH & Co. KG, Blomberg (DE)

(72) Inventors: Joachim Bury, Herford (DE); Thomas Salomon, Verl (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 15/033,680

(22) PCT Filed: Nov. 3, 2014

(86) PCT No.: PCT/EP2014/073573
§ 371 (c)(1),
(2) Date: May 2, 2016

(87) PCT Pub. No.: WO2015/063298
PCT Pub. Date: May 7, 2015

(65) Prior Publication Data
US 2016/0286679 A1    Sep. 29, 2016

(30) Foreign Application Priority Data
Nov. 4, 2013 (DE) .......................... 10 2013 112 101

(51) Int. Cl.
*H05K 7/14* (2006.01)

(52) U.S. Cl.
CPC ......... *H05K 7/1474* (2013.01); *H05K 7/1465* (2013.01); *H05K 7/1468* (2013.01); *H05K 7/1478* (2013.01)

(58) Field of Classification Search
CPC ...... H01R 9/2608; H01R 9/2408; H01R 9/26; H01R 13/514
USPC .......................................... 439/716, 717, 532
See application file for complete search history.

(56) References Cited

U.S. PATENT DOCUMENTS

| | | | | |
|---|---|---|---|---|
| 2,983,897 A | * | 5/1961 | Blanchet ................. | H01R 9/26 439/716 |
| 3,824,553 A | * | 7/1974 | Glover ..................... | H01R 9/26 439/281 |
| 3,963,296 A | * | 6/1976 | Glover ..................... | H01R 9/26 439/368 |
| 4,018,502 A | * | 4/1977 | Glaesel ................ | H01R 9/2608 439/716 |

(Continued)

FOREIGN PATENT DOCUMENTS

| | | |
|---|---|---|
| DE | 4402002 A1 | 7/1995 |
| DE | 102005028735 A1 | 12/2006 |

(Continued)

OTHER PUBLICATIONS

International search report, "PCT Application No. PCT/EP2014/073573", dated Mar. 11, 2015.

*Primary Examiner* — Gary Paumen
(74) *Attorney, Agent, or Firm* — Mannava & Kang, P.C.

(57) ABSTRACT

The present invention relates to a modular component assembly system comprising a supporting profiled rail (200) and at least one bridging module (300) for electrically connecting at least one functional component, wherein the bridging module (300) comprises a modular locking means (301) for locking the bridging module (300) onto the supporting profiled rail (200).

15 Claims, 16 Drawing Sheets

(56) References Cited

U.S. PATENT DOCUMENTS

| | | | | | |
|---|---|---|---|---|---|
| 5,641,302 | A | * | 6/1997 | Adams | H01R 4/2441 |
| | | | | | 439/417 |
| 6,371,435 | B1 | * | 4/2002 | Landis | H02B 1/052 |
| | | | | | 248/694 |
| 6,475,036 | B2 | * | 11/2002 | Morikawa | H01R 13/6395 |
| | | | | | 439/716 |
| 6,848,948 | B1 | * | 2/2005 | Khemakhem | H01P 1/045 |
| | | | | | 439/668 |
| 7,575,484 | B2 | * | 8/2009 | Van Der Mee | H01R 9/2608 |
| | | | | | 439/716 |
| 8,062,061 | B2 | * | 11/2011 | Lim | H02B 1/052 |
| | | | | | 439/532 |
| 2001/0034165 | A1 | * | 10/2001 | Landis | H01R 13/6658 |
| | | | | | 439/716 |
| 2002/0004343 | A1 | * | 1/2002 | Morikawa | H01R 13/6395 |
| | | | | | 439/716 |
| 2004/0043671 | A1 | * | 3/2004 | Brasse | H01R 13/52 |
| | | | | | 439/716 |
| 2009/0023320 | A1 | | 1/2009 | De Carolis et al. | |

FOREIGN PATENT DOCUMENTS

| | | |
|---|---|---|
| DE | 202011105337 U1 | 11/2011 |
| EP | 0527247 A1 | 2/1993 |
| EP | 0896504 A2 | 2/1999 |
| EP | 1021939 A2 | 7/2000 |
| EP | 1587352 A2 | 10/2005 |
| EP | 2157845 A1 | 2/2010 |
| WO | 0062376 A1 | 10/2000 |

* cited by examiner

COMPONENT ASSEMBLY SYSTEM

PRIORITY

The present application claims priority under 35 U.S.C. §371 to PCT Application PCT/EP2014/073573 filed on Nov. 3, 2014, which claims priority to German Patent Application No. 10 2013 112 101.2, filed on Nov. 4, 2013, the disclosures of which are hereby incorporated by reference in their entireties.

TECHNICAL FIELD

The present invention relates to a component assembly system comprising a supporting profiled rail and a bridging module for electrically connecting a functional component of the component assembly system.

BACKGROUND

Modern component systems in automation technology typically consist of a plurality of functional components arranged in a control cabinet. The energy and data distributing functions are realized by separate connector systems. Assembly without control cabinets is not possible since peripheral devices near the control cabinet hinge on a radial distribution of energy. If field bus concepts are used in which individual components are set onto backplanes, the backplanes are subject to high forces of weight.

Bridge elements can be used to electrically connect functional components. They are not, however, associated with any further mechanical functions.

Printed publication DE 30 30 906 A1 relates to a switching bridge plug. The switching bridge plug comprises two conductive bridges each having two connector pins in respective pairs parallel to one another at the spacing of the pins in a common plug part made of insulating material for conductive paths on a printed circuit board.

SUMMARY OF THE INVENTION

The task underlying the invention is that of specifying a component assembly system able to simplify the assembling of the components.

This task is solved by the subject matter features according to the independent claims. Advantageous embodiments of the invention form the subject matter of the figures, the description and the dependent claims.

According to one aspect of the invention, the task is solved by a modular component assembly system having a supporting profiled rail and at least one bridging module for electrically connecting a functional component of the component assembly system which comprises a module locking device for latching the bridging module onto the supporting profiled rail. This for example thereby achieves the technical advantage of having the same mechanical configuration on the supporting profiled rails for connectivity and functional components, dispensing with wiring for all the system's voltages and the control bus as well as any further manual interconnections there may be. Fixing the assemblies ensues by locking options both at the starting point of an assembly's bridging module as well as at the individual functional components.

The component assembly system can for example be a field bus system.

The module locking device is an embodiment of a form-locking connection for positively connecting the bridging module to the supporting profiled rail. In the embodiments described below, the module locking device can thus be generalized as a form-locking connection, wherein the interlocking is an embodiment of said form-locking connection.

In one advantageous embodiment of the component assembly system, the bridging module comprises a receiving groove for the insertion of an operational section of the functional component in order to absorb tensile forces of the functional component along the supporting profiled rail. The receiving groove achieves for example the technical advantage of preventing tensile force-related damage to the plug contacts.

In a further advantageous embodiment of the component assembly system, the module locking device comprises a rigid seating section extending around the supporting profiled rail and an elastically flexible latching section opposite the rigid seating section for locking onto the supporting profiled rail. The bridging module can thereby be pivotably latched to the supporting profiled rail.

The elastic latching section can be designed to overlap the supporting profiled rail on the side. This for example thereby achieves the technical advantage of the latching means being able to engage at the rear of the supporting profiled rail and create a stable connection.

In a further advantageous embodiment of the component assembly system, the latching section comprises a latching lug to engage behind the supporting profiled rail. This for example thereby achieves the technical advantage of being able to easily latch and secure the bridging module to the rear of the supporting profiled rail.

In a further advantageous embodiment of the component assembly system, the latching section is integrally formed on the bridging module. This for example thereby achieves the technical advantage of the bridging module being able to be produced together with the latching means in one production step.

In a further advantageous embodiment of the component assembly system, the latching section comprises a recess for increasing the flexibility of the latching section. This for example thereby achieves the technical advantage of the latching section being able to flexibly bend when being latched on even though the bridging module is formed from a relatively rigid material.

In a further advantageous embodiment of the component assembly system, the bridging module comprises a rail slot for inserting an edge of the supporting profiled rail. This for example thereby achieves the technical advantage of being able to hang the bridging module in the intended position on the supporting profiled rail from the rail slot.

In a further advantageous embodiment of the component assembly system, the rail slot is arranged on one end face of the bridging module and the module locking device is arranged on an opposite end face of the bridging module. This for example thereby achieves the technical advantage of being able to first hang the bridging module on the supporting profiled rail and then lock it on with a rotational motion.

In a further advantageous embodiment of the component assembly system, the module locking device is centrally arranged on one or two opposite end faces of the bridging module. This for example thereby achieves the technical advantage of forces being transferred evenly from the bridging module to the supporting profiled rail. Both seating and pivoting into position is possible from the end face or the rear side of the module bridge, as is also a direct linear seating and joining of the modular bridge to the supporting profiled rail.

In a further advantageous embodiment of the component assembly system, the bridging module comprises a centering section for centering the bridging module on the supporting profiled rail. This for example thereby achieves the technical advantage of being able to easily seat the bridging module in the intended position and additionally being able to stabilize it on the supporting profiled rail by way of the centering section.

In a further advantageous embodiment of the component assembly system, the module locking device comprises a pocket for the insertion of a tool to bend the module locking device upward. This for example thereby achieves the technical advantage of being able to easily remove the bridging module from the supporting profiled rail.

In a further advantageous embodiment of the component assembly system, the pocket is situated on the latching section opposite the latching lug. This for example thereby achieves the technical advantage of directly transferring the forces exerted on the pocket to the latching lug and being able to remove the bridging module with little effort.

In a further advantageous embodiment of the component assembly system, the pocket is formed by a balcony section projecting from the latching section. This for example thereby achieves the technical advantage of the pocket being able to be integrally and stably formed by the balcony section.

In a further advantageous embodiment of the component assembly system, the inadvertent opening, upward bending and disengaging of the module locking device when assembled with the functional component is prevented by an obstructive overlapping of a functional component housing.

In a further advantageous embodiment of the component assembly system, the bridging module comprises a dovetail slot for laterally fixing the bridging module to a terminal block. This for example thereby achieves the technical advantage of being able to easily fix the bridging module laterally.

In a further advantageous embodiment of the component assembly system, the bridging module comprises a locking device for non-displaceably locking the bridging module to the supporting profiled rail. This for example thereby achieves the technical advantage of increasing the stability of an assemblage of elements on the supporting profiled rail.

In a further advantageous embodiment of the component assembly system, the component assembly system comprises a functional component, wherein the functional component has a functional component bottom part able to be set onto the bridging module and a functional component upper part able to be set onto the functional component bottom part, and wherein the component assembly system can be laterally extended by a second functional component via the bridging module.

In a further advantageous embodiment of the component assembly system, the functional component upper part forms a connection interface for the functional component bottom part and a further connection interface for a further functional component upper part attachable onto the functional component upper part.

In a further advantageous embodiment of the component assembly system, the functional component bottom part comprises a component securing device for holding the functional component on the supporting profiled rail.

In a further advantageous embodiment of the component assembly system, the bridging module and/or the functional component (400) is/are displaceable on or along the supporting profiled rail.

In a further advantageous embodiment of the component assembly system, the functional component bottom part and the bridging module are connectable in a form-fit connection to absorb the tensile forces acting on the connection between the bridging module and the functional component bottom part along the supporting profiled rail.

In a further advantageous embodiment of the component assembly system, the bridging module comprises a dovetail slot for laterally fixing the bridging module to a terminal block.

In a further advantageous embodiment of the component assembly system, the component assembly system comprises a terminal block for fixing the bridging module against displaceability on the supporting profiled rail, wherein the terminal block is connectable to the bridging module.

In a further advantageous embodiment of the component assembly system, the terminal block is friction-lock or form-lock connectable to the bridging module, particularly by means of a T-slot/groove connection, a dovetail connection, a screwed connection or a clamped connection.

In a further advantageous embodiment of the component assembly system, the terminal block is designed to positively engage around and/or frictionally clamp the supporting profiled rail.

In a further advantageous embodiment of the component assembly system, the terminal block has an externally conducting grounding terminal which is electroconductively connectable to the supporting profiled rail.

Further embodiments of the invention are depicted in the drawings and will be described in greater detail below. Shown are:

DETAILED DESCRIPTION

Figure 1:
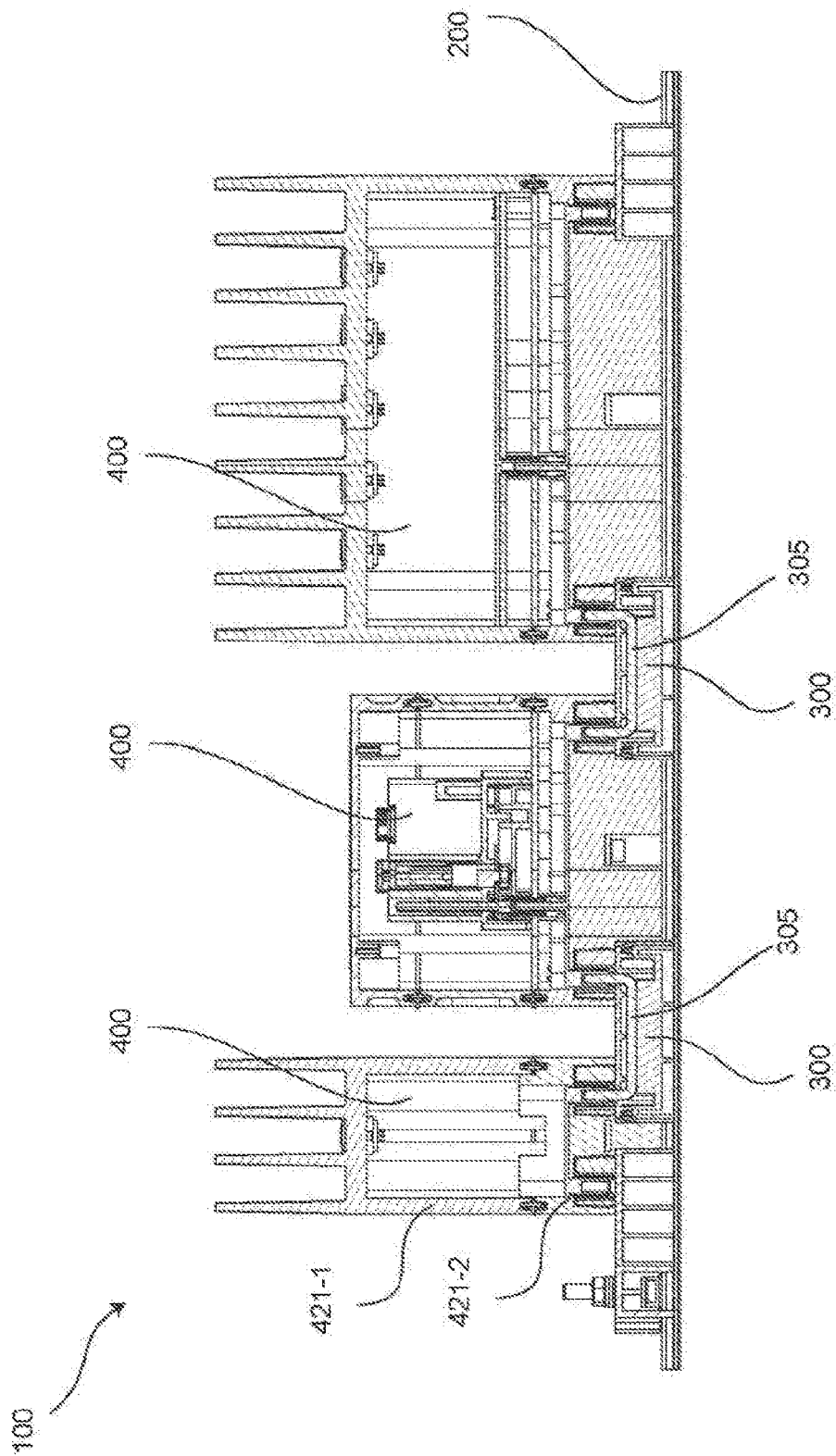
FIG. 1 a cross-sectional view of a component assembly system.

FIG. 1 shows a cross-sectional view of a component assembly system 100. The component assembly system 100 is composed of an interconnectable housing assembly unit by means of which the components can be latched onto a supporting profiled rail 200. The structural concept of the component assembly system 100 encompasses a supporting profiled rail 200 as a mounting platform, bridging modules 300 and functional components 400, each consisting of a connective bottom part and a functional upper part.

Different embodiments of the structural concept can be realized depending on the intended application. The structural concept is infinitely extensible. The internal electrical connections for energy distribution of for example 400V or 24V and the data bus are realized simultaneously with plugging the components together. The connecting functions are realized in the functional component bottom part 421-2 of functional components 400 and the bridging modules 300 by bridging plugs 305. The supplying, shielding, switching functions result from the sequential arrangement of the functional components 400. The application functions, such as for example supplying, shielding and switching, are realized in the functional component upper part 421-1 which is connected to the functional component bottom part 421-2 by plug contacts.

The functional component upper part 421-1 has a defined mechanical and electrical interface with the functional component bottom part 421-2 and can also be used with other functional component bottom parts 421-2 having the same interface. The functional component bottom part 421-2 only incorporates the connection system. The separating, shielding or switching functions, for example, are incorporated in the functional component upper part 421-1. The direction of action of the above-cited functions is effected in the line and/or in the load outflow dependent on the functional component upper part 421-1 and the functional component bottom part 421-2; i.e. a plug connection in the functional component upper part 421-1. The connectivity can be disengaged in the functional component bottom part 421-2.

The supporting profiled rail 200 forms a one-piece supporting system with a wide rail for a rack mount which emulates the geometry of the supporting edges of the bridging module 300 and the functional components 400. Alternatively, two separate standard supporting profiled rails can be used as a two-piece supporting system, e.g. 35 mm wide, for a wall mount. The supporting profile can be formed by a top-hat profile.

Figure 2:
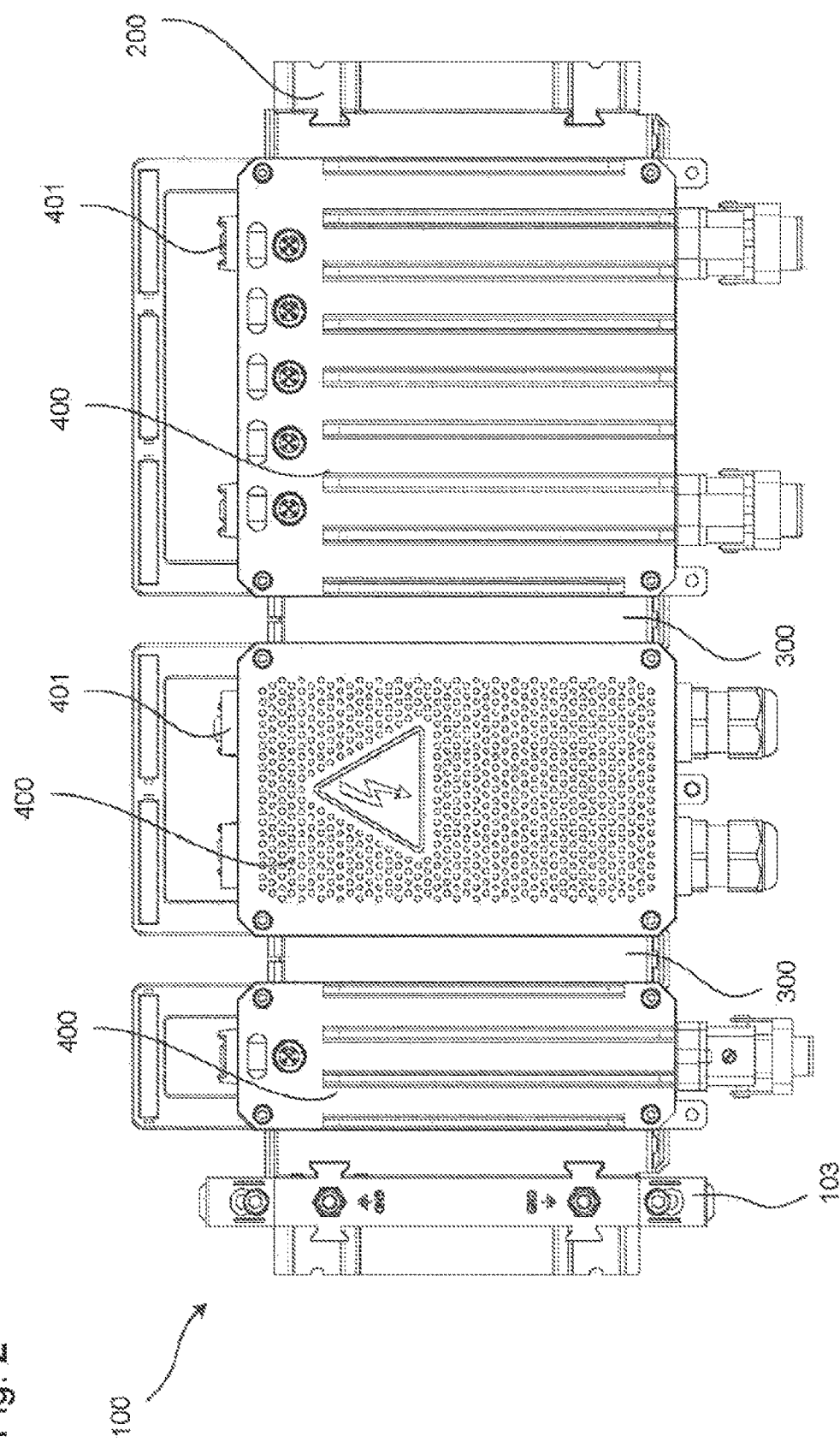
FIG. 2 a top view of the component assembly system.

FIG. 2 shows a view of the component assembly system 100. Latchable bridging modules 300 with forward-facing bridging plugs 305 are snapped onto the supporting profiled rails 200 as an electrical connection for energy distribution and the data bus.

The mounting direction of the bridging module is perpendicular to the plane spanned by the supporting profiled rails 200. The functional components 400 each comprise one or more component securing devices 401 for fixing the functional component 400 to the supporting profiled rail 200. A terminal block 103 is situated on the left side of the assemblage.

Figure 3:
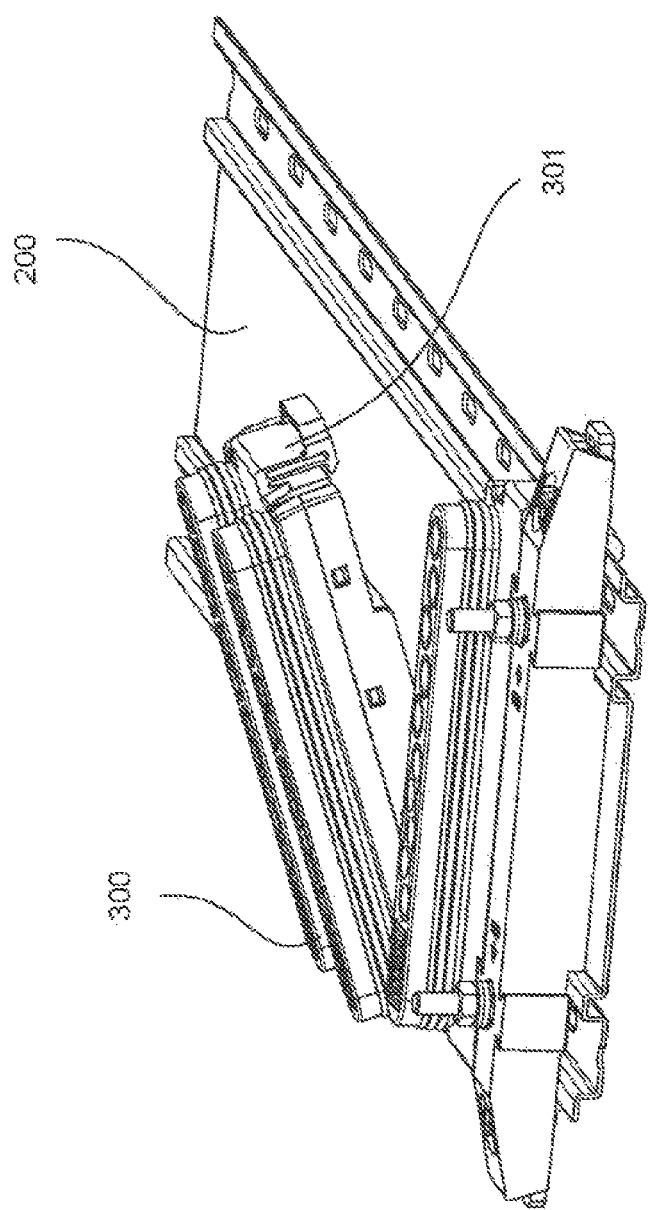
FIG. 3 a perspective view of a supporting profiled rail with a bridging module.

FIG. 3 shows a perspective view of a supporting profiled rail 200 with the bridging module 300. The bridging module 300 comprises the plug contacts and a module locking device 301 for latching the bridging module 300 onto the supporting profiled rail 200 when the bridging module 300 is being seated. The bridging modules 300 are freely displaceable along the supporting profiled rail 200 after being latched on.

Figure 4:
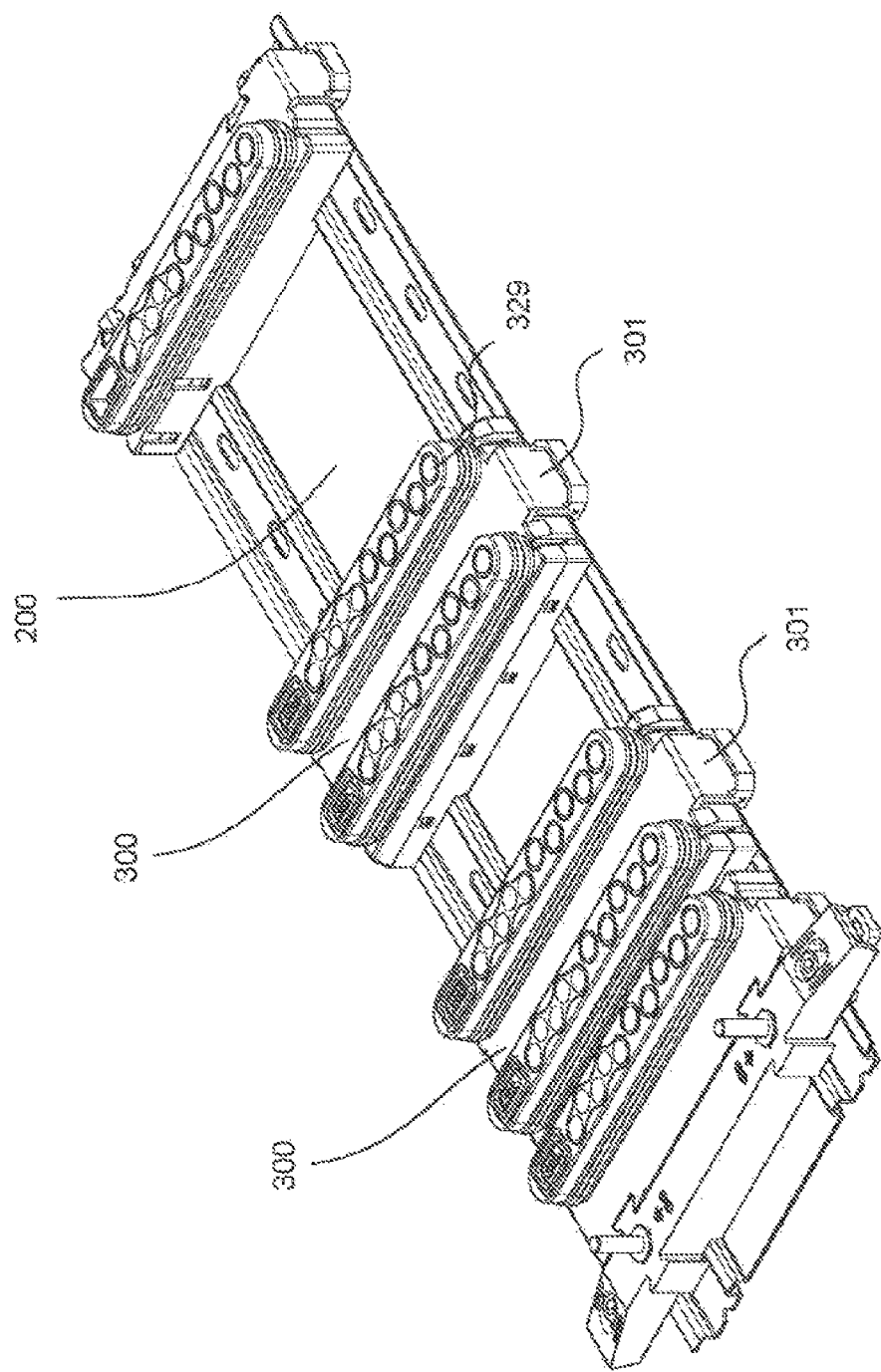
FIG. 4 a further perspective view of the supporting profiled rail with multiple bridging modules.

FIG. 4 shows a further perspective view of the supporting profiled rail 200 with multiple bridging modules 300. The bridging modules 300 can be realized in different widths so that the bridging modules 300 dictate the distance between joined functional components 400. This spacing defines a ventilation channel between the functional components 400 which for example comprises a metallic functional component upper part 421-1 as a heat sink. The resulting airway serves to laterally dissipate the heat of the functional components 400. A free space between the functional components 400 can furthermore be used for vertical wiring in the lower housing section since no heat sink is situated there.

Figure 5:
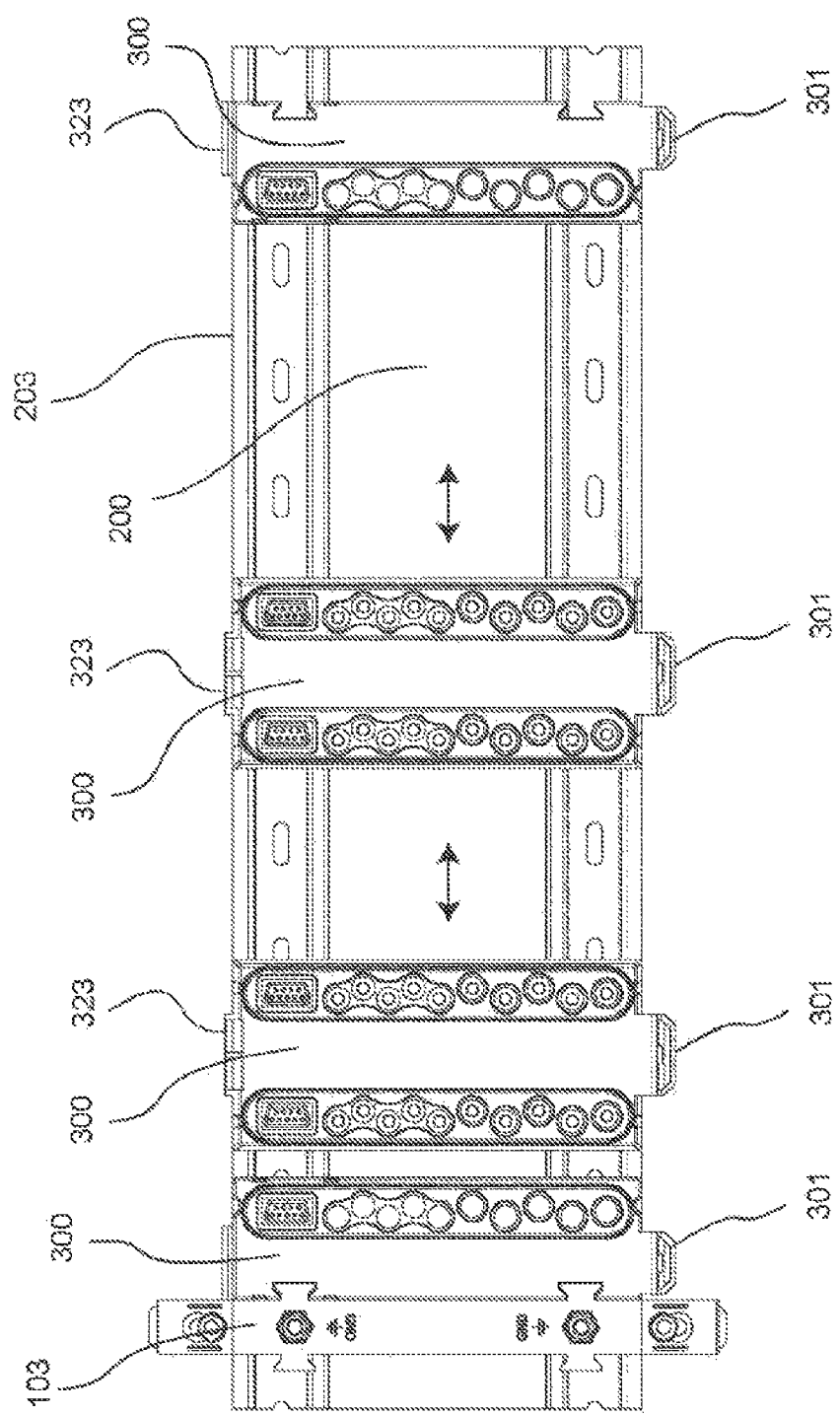
FIG. 5 a view of the supporting profiled rail with a plurality of bridging modules.

FIG. 5 shows a view of the supporting profiled rail 200 with multiple bridging modules 300. The supporting profiled rail 200 has a lower edge and an upper edge 203. The bridging modules 300 are laterally displaceable in the direction of the arrow in the mounted state. The free displaceability of the bridging module 300 enables, albeit not imperatively, a non-locked mounting on the supporting profiled rail 200. After being latched on, the bridging module 300 is displaceable at will on the supporting profiled rail 200 and can be used to adapt to any functional component 400 housing width, thereby eliminating a mandatory grid.

When a left bridging module 300 is mounted, a left arm of the functional unit runs flush with the left bridging module 300 upon assembly. The right arm pushes the right bridging module 300 to its limit on the base of the functional housing of the functional component 400. The left arm thereafter clips the functional component 400 to the two connector faces of the bridging module 300. The mechanical positioning of the functional components 400 in the remote location is generally unrestricted. The line's arrangement and sequence determine function.

Figure 6:
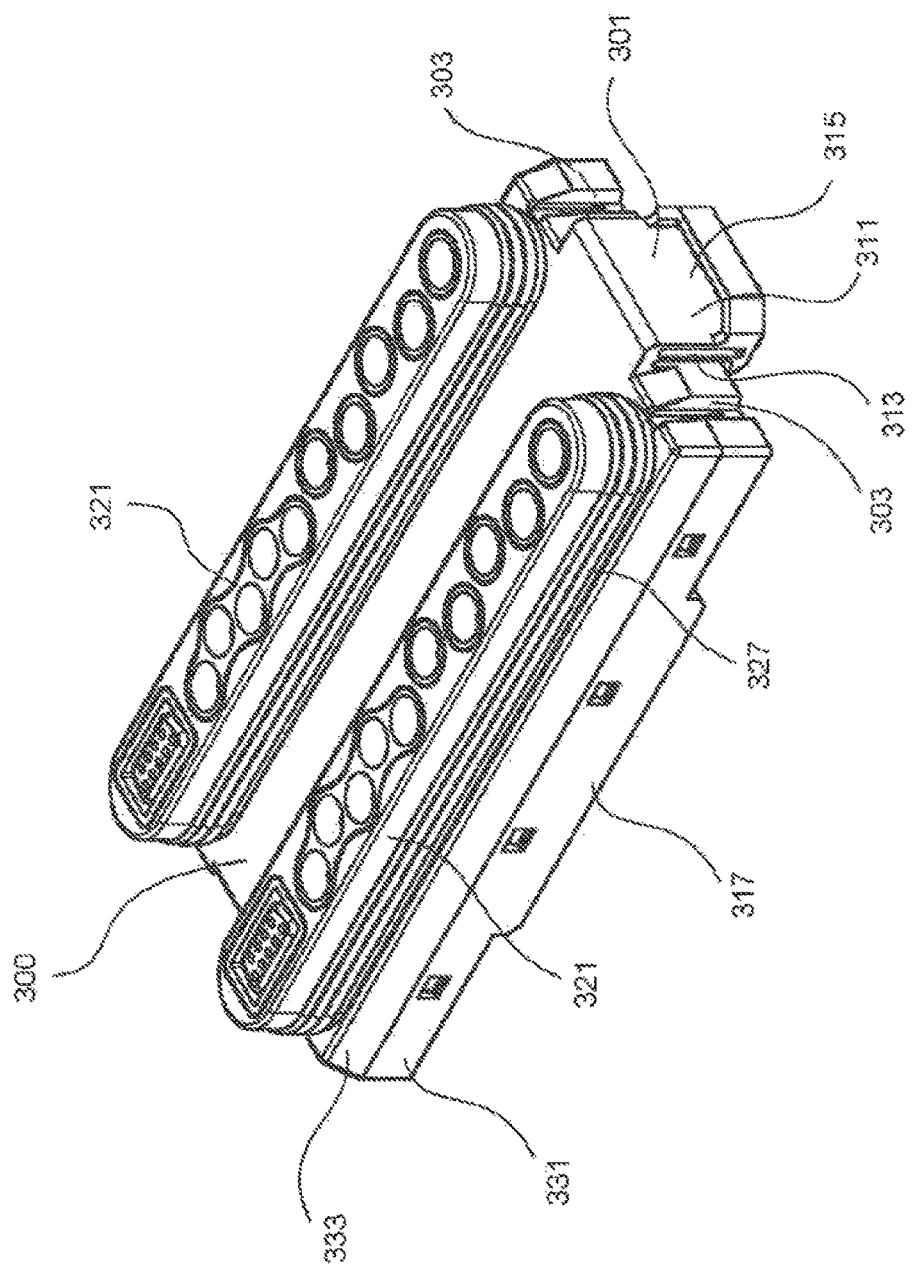
FIG. 6 a perspective view of a bridging module.

FIG. 6 shows a perspective view of a bridging module 300. The bridging module 300 serves pre-assembly by latching onto the supporting profiled rail 200 as well as the electrical connection of functional components 400 of the component assembly system 100. The bridging module 300 can be produced in different widths so as to achieve a specific spacing of the functional modules 400 employed. The bridging module 300 can for example have a width of 70 mm so that an airway 20 mm wide is formed in combination with the functional components 400.

The bridging module 300 comprises a functional component bottom part 331, a functional component upper part 333 and not-shown housing sealings as well as a seal 327, e.g. with a sealing when remote or without a sealing in a control cabinet. Notches/screws/pressure/welding/adhesive provide a housing connection. The electrical structure of the bridging module 300 provides connections for low and extra-low voltages. To this end, conductors or plugs of curved round wire or as punch-formed parts or as feeder rails of stamped sheet metal with contacted connector pins and connectors on a passive or active board for a data bus connection are provided within the bridging module 300. The bridging module 300 with different plug gaps is provided in order to create specific clearances between the functional components.

At the front, the bridging module 300 has two protruding connector sections 321 which form the connector face. A right and a left functional component 400 are in each case fitted onto the connector sections 321. The connector sections 321 have a circumferential seal 327 so as to form a sealing system for the fitted functional components.

The bridging module 300 has a respective receiving groove 303 on each of the transverse sides for insertion of an operational section of a right-mounted or left-mounted functional component 400 in order to absorb tensile forces of the functional component 400 along the supporting profiled rail 200. The operational section of the functional component 400 and the receiving groove 303 produces a positive connection between the functional component 400 and the bridging module 300, thereby preventing tensile forces from damaging the connector section 321.

To mechanically uncouple the float-mounted electrical plug connections of bridging modules 300 and functional components 400, a higher-level mechanical pre-centering occurs. This ensues by a rib arranged above and below the connector assembly in functional component 400 mechanically engaging in the corresponding receiving groove 303 in the bridging module 300 and respectively fitting in the end position in the x and y direction.

Doing so thus mechanically decouples the forces acting in the x and y direction on the electrical plug connection. Drawing forces of the functional components 400 in the z direction are decoupled by appropriate locking slides situated in the functional components and engaging behind the supporting profiled rail. There is thus a mechanical blocking of all the possible degrees of freedom between the bridging modules 300 and the functional components 400 in the mounted state.

The bridging module 300 additionally comprises a module locking device 301 on one of the transverse sides for latching the bridging module 300 onto the supporting profiled rail 200. The module locking device 301 is formed by an elastic latching section 311 which overlaps the side of the supporting profiled rail 200 after the bridging module 300 is seated. The latching section 311 has an elongated recess 313 which extends along said latching section 311 to increase the flexibility of the latching section 311. The bridging module 300 can thus be formed as a single piece from a rigid plastic without the latching section 311 being too rigid.

A protruding balcony section is formed at the end of the latching section 311 as pocket 315. The pocket 315 serves for the insertion of a tool, e.g. a screwdriver. The latching section 311 can be outwardly bent by tilting the tool sideways so that the bridging module 300 can be separated from the supporting profiled rail 200.

A protruding centering section 317 is situated on the rear of the bridging module 300 which additionally stabilizes and supports the bridging module 300 on the supporting profiled rail 200. To this end, the upper and lower side of the centering section 317 respectively abut against the upper or lower supporting profile of the supporting profiled rail 200.

Figure 7:
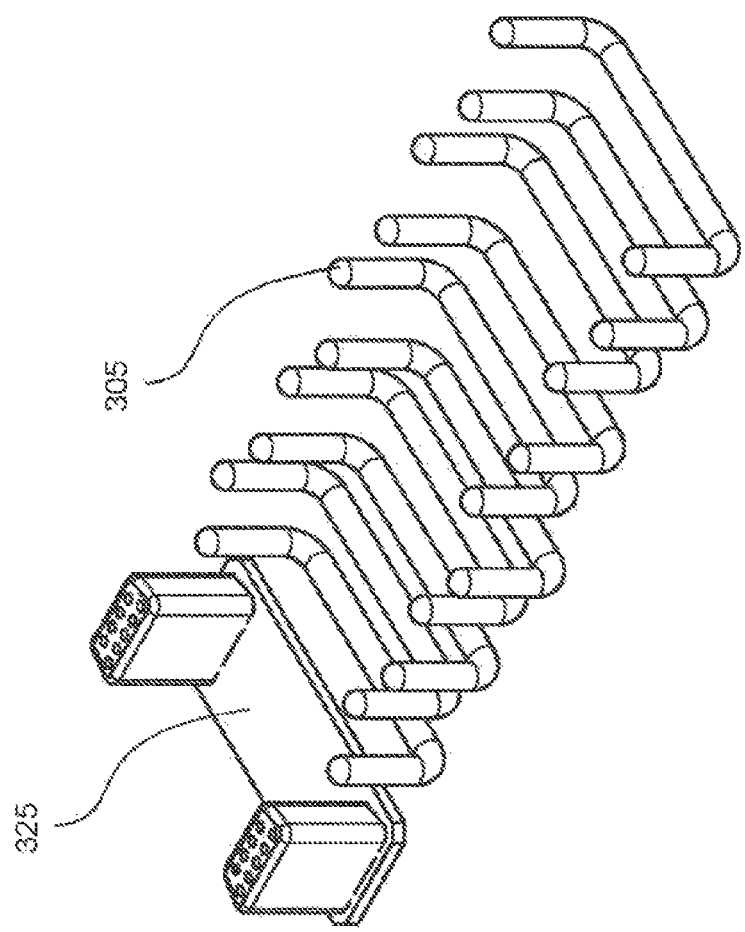
FIG. 7 a perspective view of a plurality of bridging plugs.

FIG. 7 shows a perspective view of multiple bridging plugs 305 and 325. The bridging plugs 305 are formed by U-shaped round conductors which relay the electric voltages and currents from one functional component 400 to the other functional component 400. A self-assembly interconnect bus for voltages of 400 V and 2×24V can for example be formed by the round conductors.

The bridging plug 325 comprises a plurality of electrical connections for the parallel or serial transmitting of data signals between the functional components 400. This thus enables a data bus to be realized between the functional components 400. The bridging plugs 305 and 325 are accommodated by the bridging module 300 and form an internal wiring. The bridging plug 325 is exchangeable so that a bridging module 300 with exchangeable component assemblies for different data bus variants results.

Figure 8:
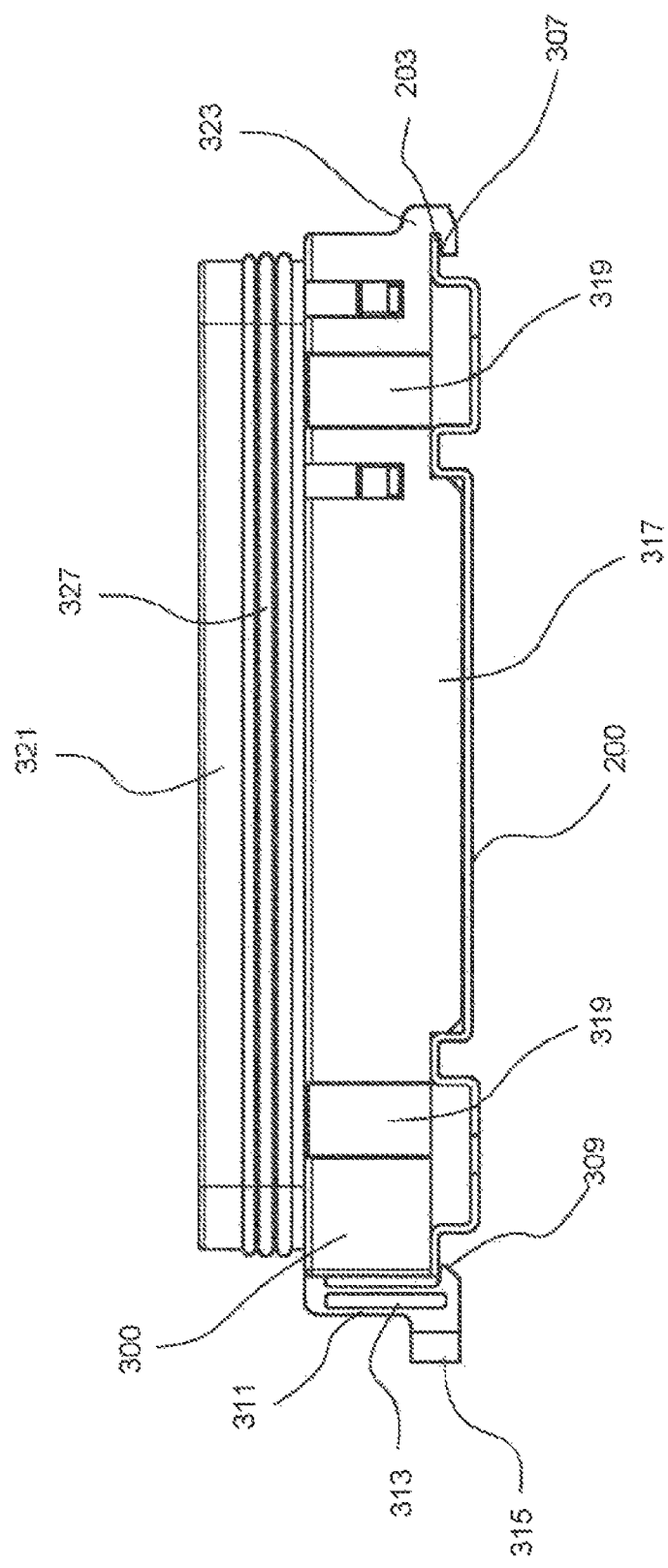
FIG. 8 a side view of the bridging module on the supporting profiled rail.

FIG. 8 shows a side view of the bridging module 300 on the supporting profiled rail 200. The centering section 317 is situated between the two supporting profiles of the supporting profiled rail 200. The latching section 311 is integrally formed on the side of the bridging module 300. A latching lug 309, which can for example be a locking hook, is situated at the end of the latching section 311 and engages behind the supporting profiled rail 200 after the bridging module 300 is seated.

A rail slot 307 is provided on the opposite side for the insertion of an edge 203 of the supporting profiled rail 200. The rail slot 307 is formed within a U-shaped seating section 323 which engages around the edge 203 of the supporting profiled rail 200 and is integrally formed on the bridging module 300. The seating section 323 is arranged on the transverse side of the bridging module 300 opposite the transverse side with the module locking device 301. Two dovetail slots 319 are situated on the longitudinal side of the bridging module 300 for laterally fixing the bridging module 300 to the terminal block 103.

Figure 9:
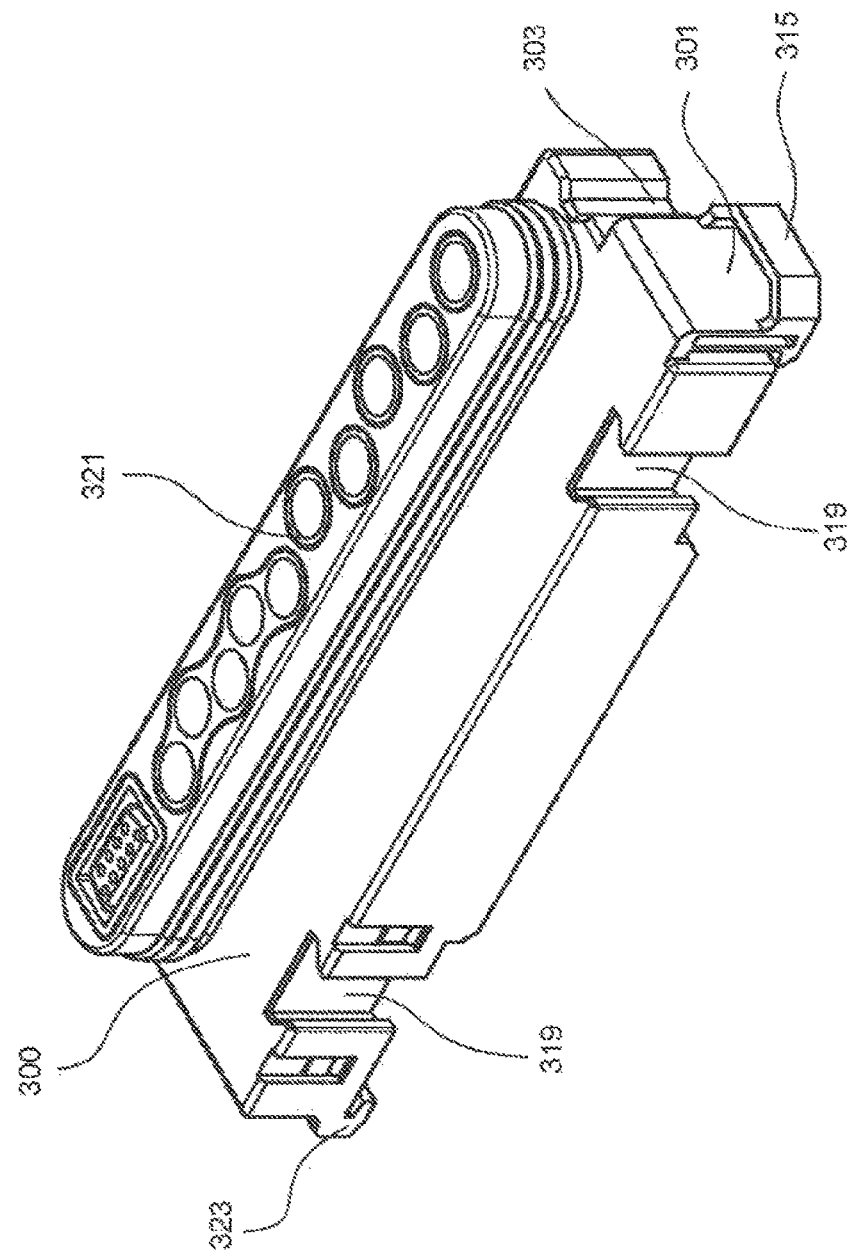
FIG. 9 a perspective view of a further bridging module.

FIG. 9 shows a perspective view of a further bridging module 300. The bridging module 300 exhibits the two dovetail slots 319 for the left-side fixing of the bridging module 300 to the terminal block 103. The bridging module 300 forms a starting module for the right-side extension of the component assembly system 100 by insertion of a functional component 400 and has only one seating section 321. A module locking device 301 and a receiving groove 303 are likewise provided on each transverse side of the bridging module 300.

Figure 10:
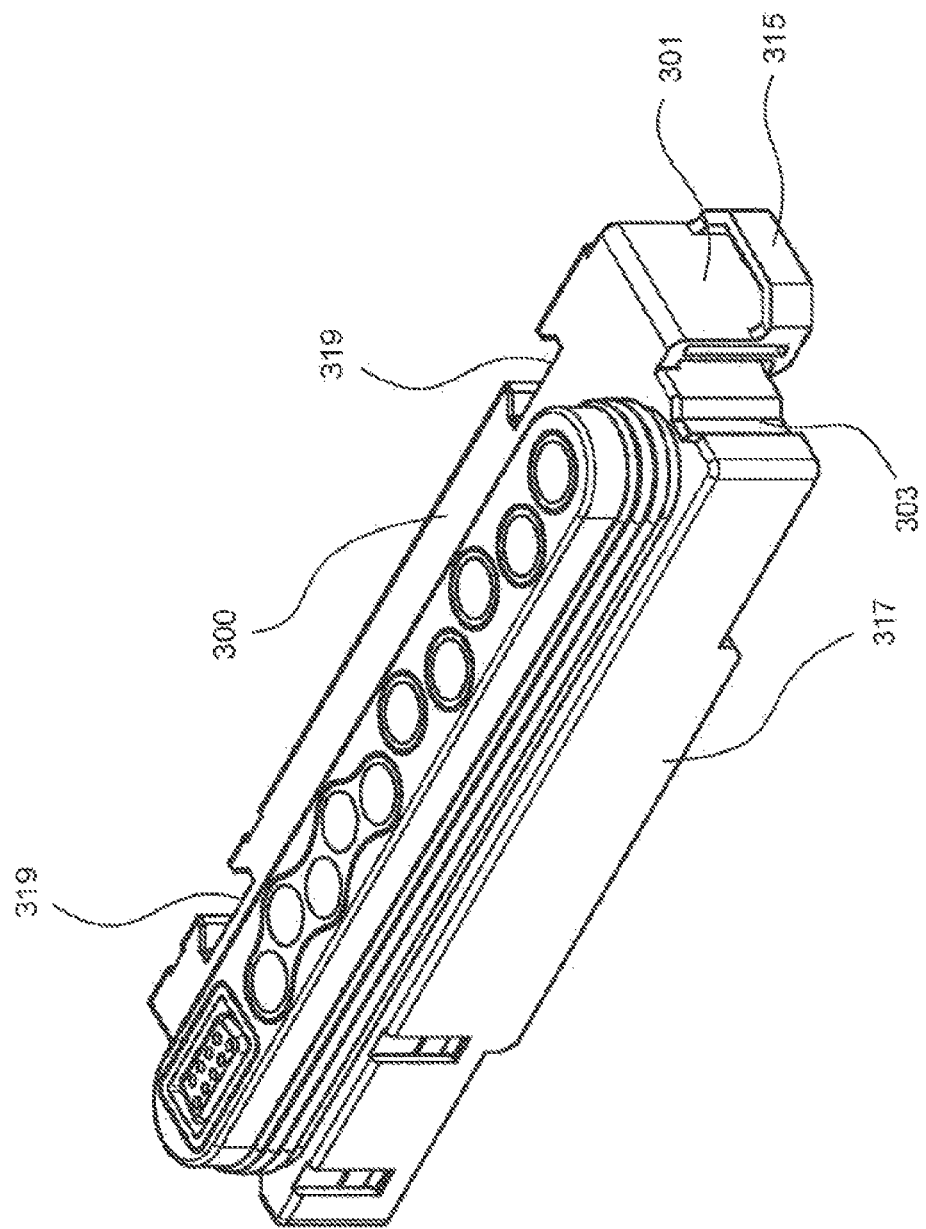
FIG. 10 a perspective view of a further bridging module.

FIG. 10 shows a perspective view of a further bridging module 300. The bridging module 300 likewise comprises the two dovetail slots 319 for the right-side fixing of the bridging module 300 to the terminal block 103. The bridging module 300 forms an end module for terminating the self-assembly field bus and likewise comprises only one connector section 321. A module locking device 301 and a receiving groove 303 are likewise provided on each transverse side of this bridging module 300.

The bus termination can alternatively be formed by a conventional bridging module 300 having two connector sections 321, with a cap piece placed on the unused connector section 321 as an attachable contact protection.

Figure 11:
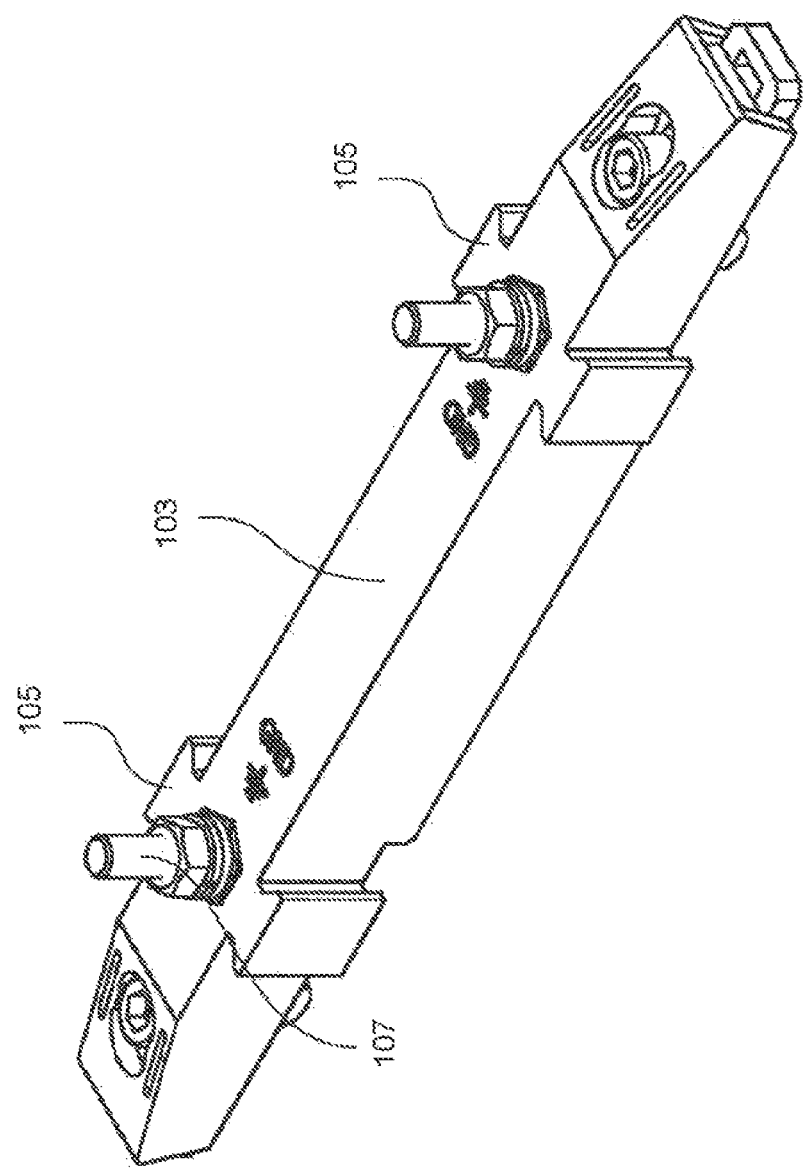
FIG. 11 a perspective view of a terminal block.

FIG. 11 shows a perspective view of the terminal block 103 with two grounding terminals 107. The terminal block 103 is screwed to the supporting profiled rail 200 and is immovable. The terminal block 103 comprises four dovetail sections 105, of which two each can be inserted into the dovetail slots 319 of the bridging module 300 on the right or left, thereby fixing the position of the starting or end module on the supporting profiled rail 200.

The bridging module 300 is the key connecting element in the structural concept of the housing of the component assembly system 100 which assumes the electrical connections between the functional components 400 and, together with the supporting profiled rail 200, represents the connection to the conventional structural design technology. Generally speaking, the bridging module 300 can be configured as a floating bearing, which is only fixed to the supporting profiled rail 200 by latching and is displaceable, or as a fixed bearing having a metallic clamping arrangement and PE contacting.

Figure 12:
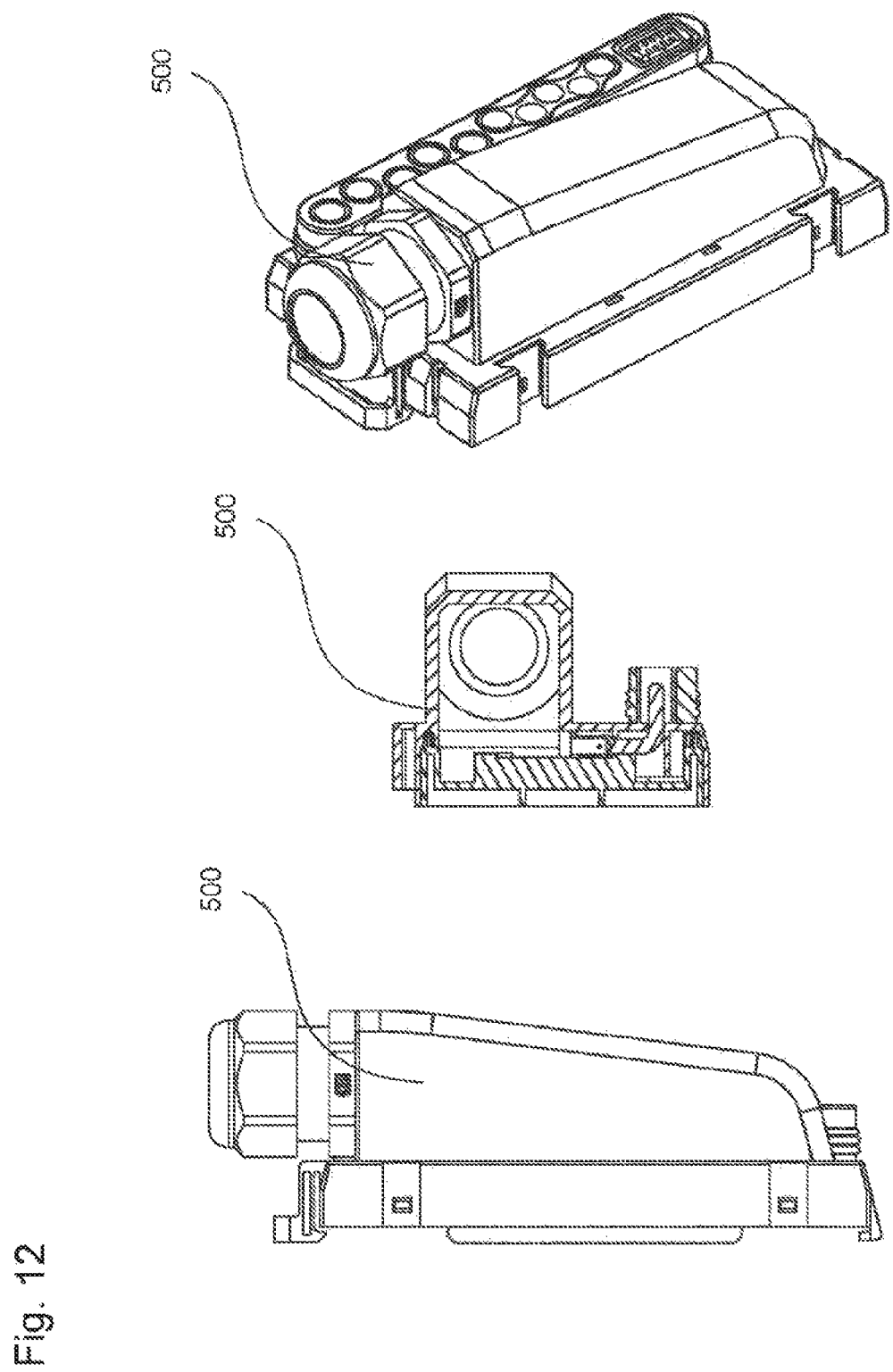
FIG. 12 various views of a floating-bearing terminal bridging module.

FIG. 12 shows various views of a floating-bearing terminal bridging module 500. The floating-bearing terminal bridging modules 500 can be used on the right in a right side-oriented realization or on the left in a left side-oriented realization. The floating-bearing terminal bridging module 500 can moreover optionally be used as a power supply or power feeder by utilizing prefabricated connecting lines with crimped connector pins. A floating-bearing intermediate bridging module can be provided in different widths.

Greater distances between the functional components 400 serve in the additional lateral circulation around the functional components 400 in order to improve cooling and create space for cable lead-throughs and feeds as well as improve accessibility upon greater line density. Lesser distances between the functional components 400 result in a compressing of the overall system dimensions and an overall more compact design.

Figure 13:
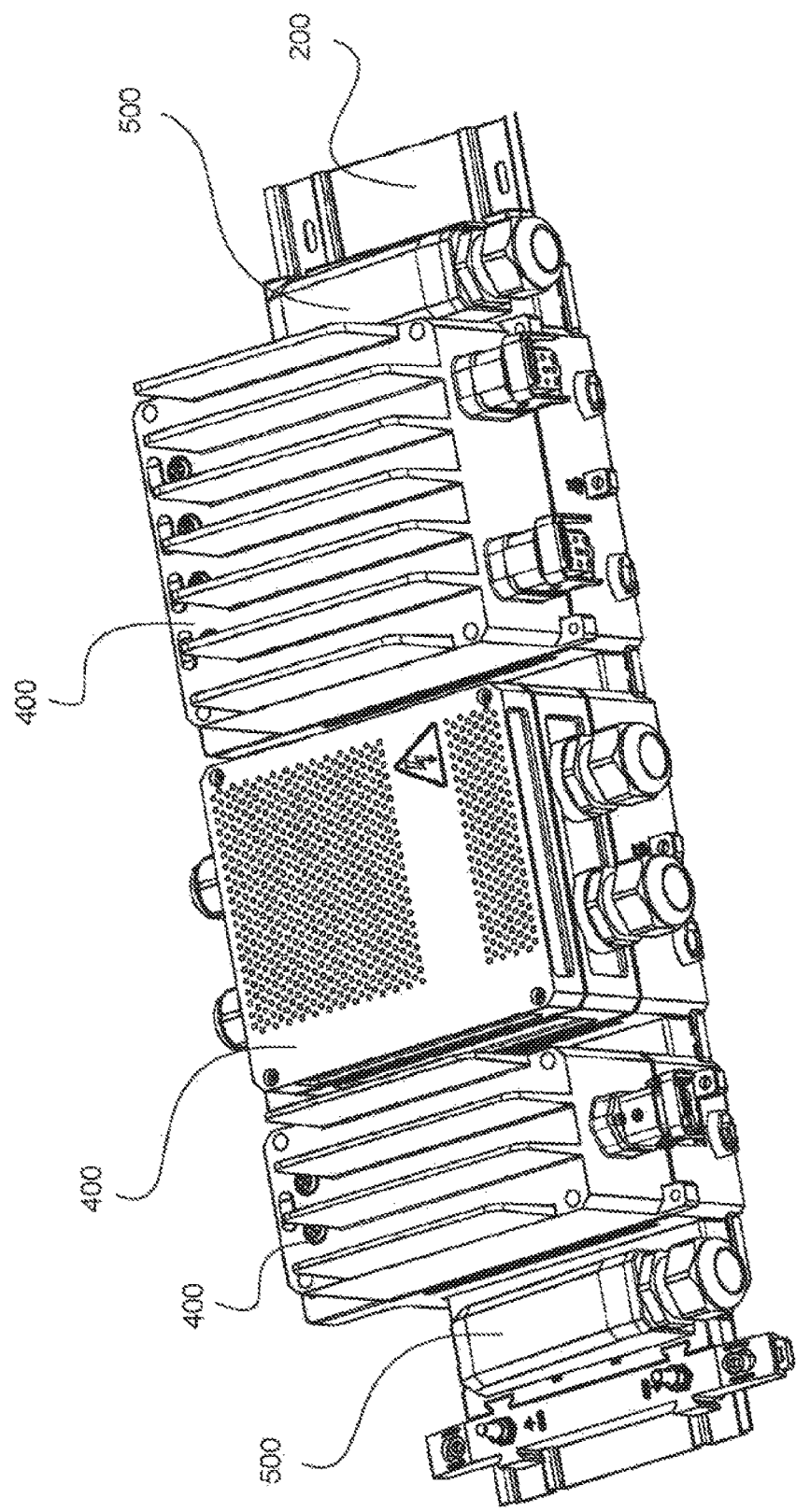
FIG. 13 a view of a floating-bearing terminal bridging module together with the other field bus components.

FIG. 13 shows a view of a floating-bearing terminal bridging module 500 in conjunction with the other field bus components 400. A bridging plug start/end of the floating-bearing 500 serves in terminating the self-assembly interconnect bus on the left and right side with attachable bus terminators. The bridging module 300 can be provided as a displaceably latched floating bearing or as a fixed bearing having a metallic clamping arrangement and PE contacting.

Figure 14:
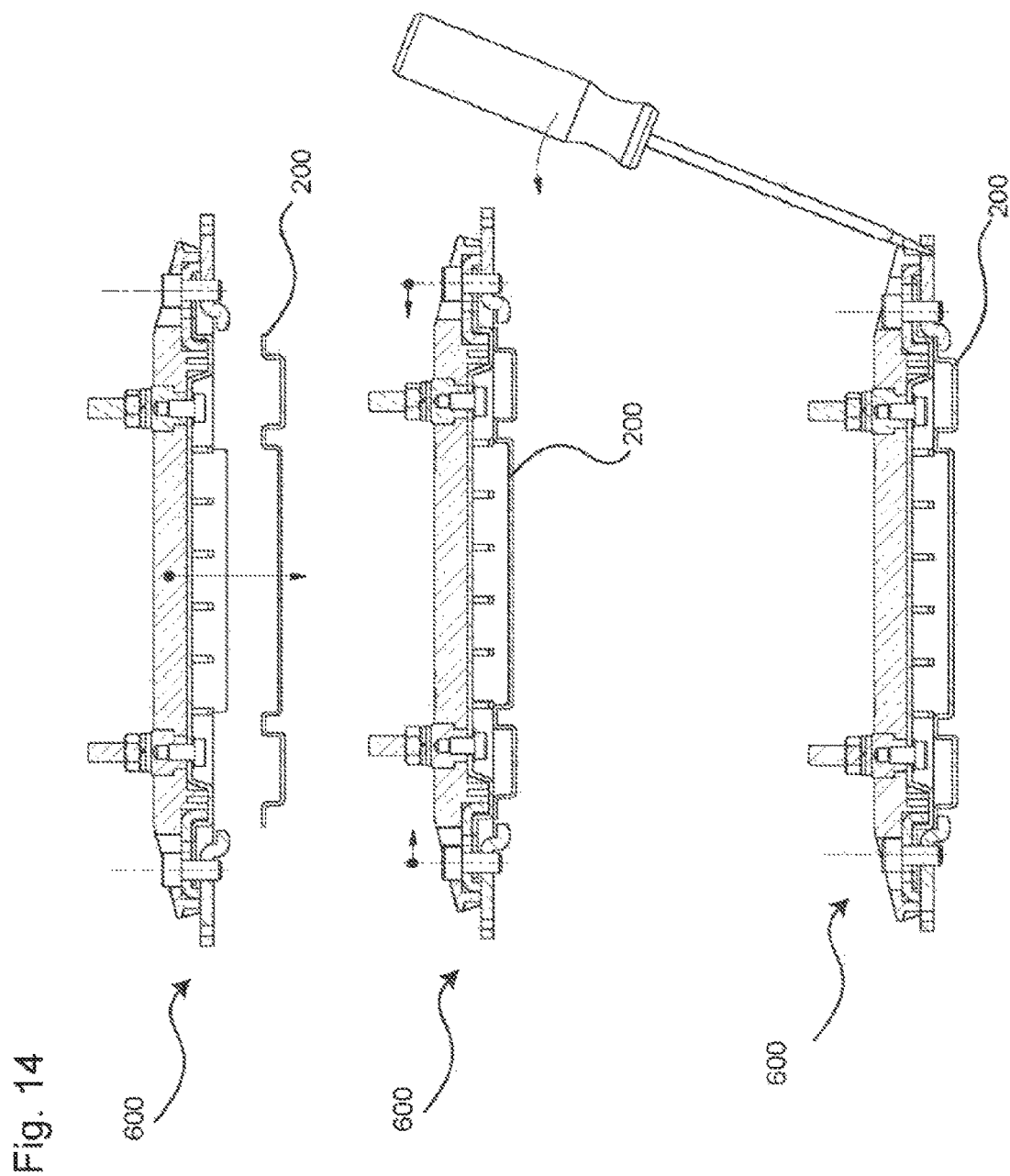
FIG. 14 various views of a fixed-bearing grounding module.

FIG. 14 shows a fixed-bearing grounding module 600. A mechanical fixing of the entire system structure along the supporting profiled rail 200, resulting from the displaceability of the bridging module 300 on the supporting profiled rail 200 itself, is achieved by utilizing the right or left disposed fixed-bearing grounding module 600.

The fixed-bearing grounding module 600 fixes the entire system to a fixed point on the supporting profiled rail 200 in the x direction. With this configuration, the system structure can freely distend in the x direction from a fixed point, such as for example upon a thermally-induced longitudinal expansion. The mechanical clamping of this fixed point is at the same time the central electrical grounding and connection to the supporting profiled rail of the system assembly.

Figure 15:
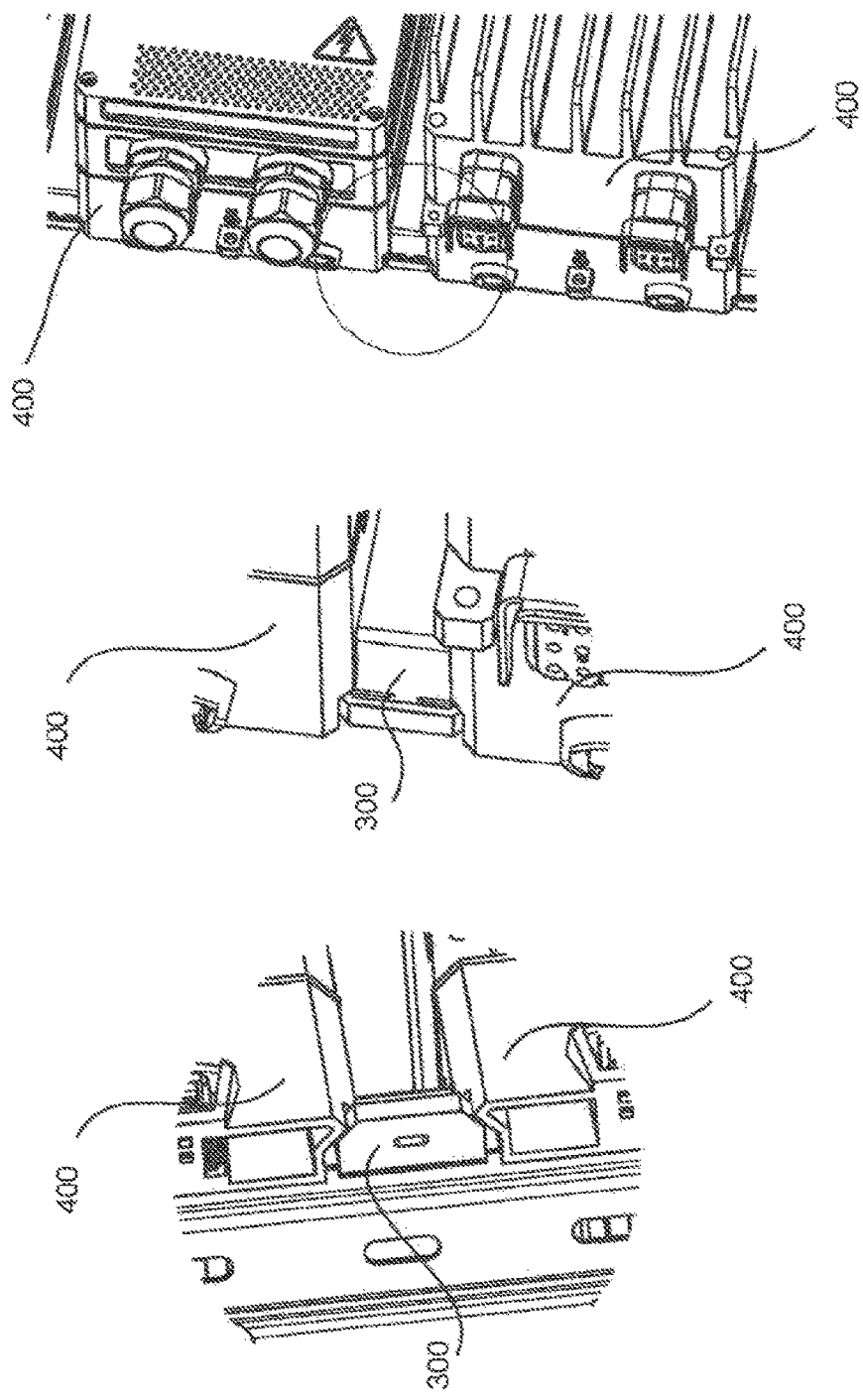
FIG. 15 enlarged views of a connection with the bridging module.

FIG. 15 shows enlarged views of a connection with the bridging module 300. The technically proper assembly and disassembly sequence; i.e. first bridging module 300, then functional component 400, and the reverse when disassembling, is mandatorily ensured by the mechanical design of the bridging module 300 and functional components 400. The functional devices are also visible in the mounted state and thus self-explanatory.

Figure 16:
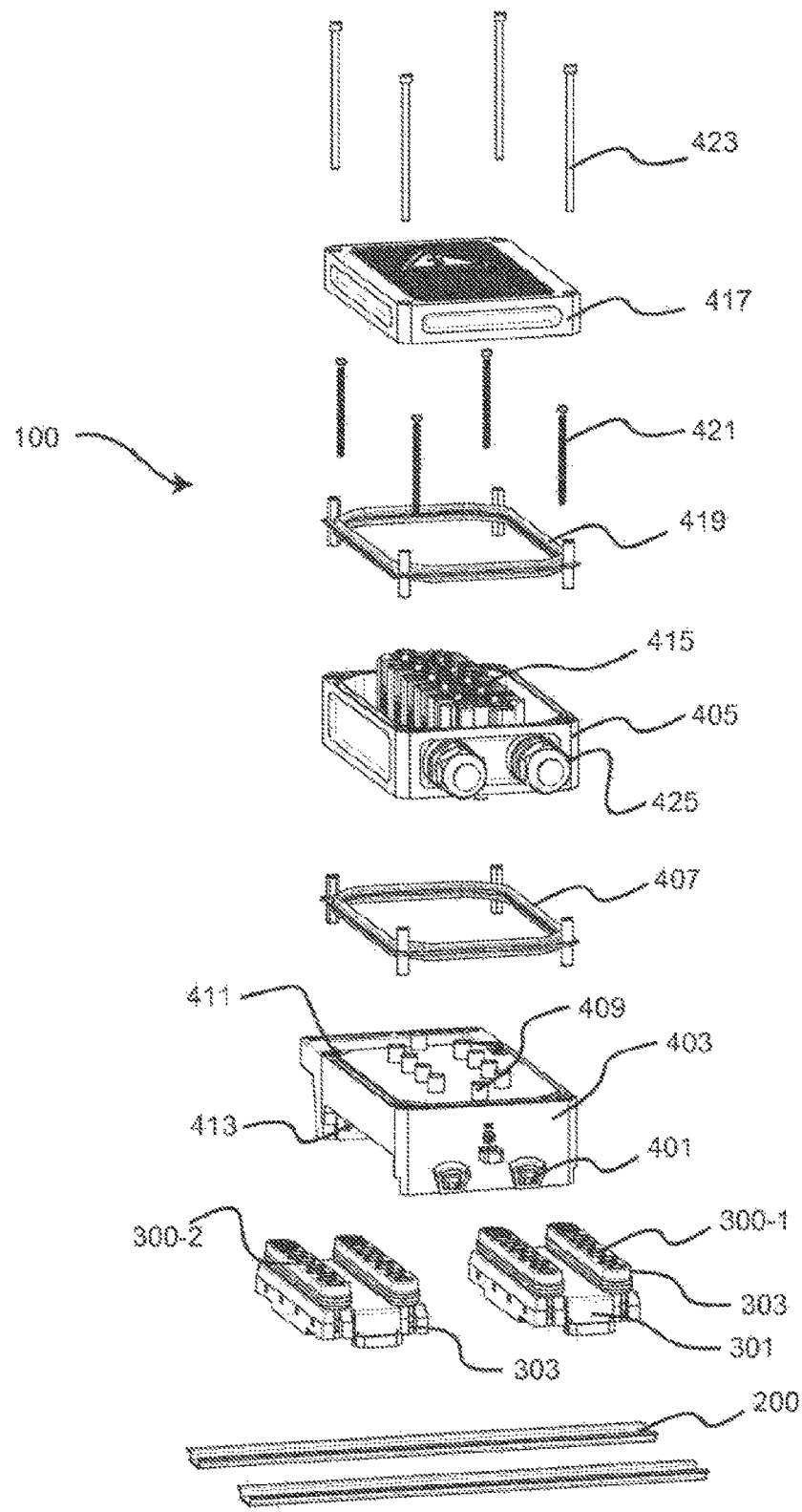
FIG. 16 an exploded view of the component assembly system.

FIG. 16 shows an exploded view of the component assembly system 100. The bridging modules 300-1 and 300-2 can be set onto the supporting profiled rail 200 and are displaceable along said supporting profiled rail 200. A functional component bottom part 403 has a respective connecting device for electrically connecting to the left bridging module 300-2 and to the right bridging module 300-2. The connecting devices are formed for example by sockets into which the projecting contact sections 307 of the bridging modules 300-1 and 300-2 can be inserted. The functional component bottom part 403 enables an electronic function expansion option by electrically and mechanically forming an upward interface. The bridging module 300 allows the interfaces to be electrically and mechanically stacked to any desired length to the left and/or right.

The functional component bottom part 403 and the bridging module 300-1/300-2 are respectively positively connectable, e.g. by way of a tongue-and-groove connection. The functional component bottom part 403 comprises for example a protruding operational section 413, e.g. a spring, on the underside for insertion into a receiving groove 303 of the respective bridging module 300-1 and 300-2 in order to absorb tensile forces of the functional component bottom part 403 along a supporting profiled rail 200. The functional component bottom part 403 of the functional component 400 is fixed to the supporting profiled rail 200 by a component securing device 401, e.g. a snap-lock connection.

A circumferential notch 411 is formed on the upper side of the functional component bottom part 403, into which an annular sealing element 407 can be inserted. The sealing element 407 seals the gap between the functional component bottom part 403 and the functional component upper part 405. Depending on the sealing element 407, different types of protection from IP20 to IP6x can be realized. A plurality of projecting connector plug sections 409 forming a connector face can additionally be formed on the upper side of the functional component bottom part 403. The connector plug sections 409 form an interface for the electrical and mechanical connection of the functional component upper part 405.

A contact block 415 having a plurality of terminals is situated within a functional component upper part 405 for connecting individual electrical conductors such that the functional component upper part 405 has a distributor function. The functional component upper part 405 comprises a cover 417 without an electrical connector unit which is seated together with the sealing element 419. The sealing element 419 is fixed to a frame-shaped housing section 425 of the functional component upper part 405 by means of the four screws 421. The functional component upper part 405 is screwed to the functional component bottom part 403 by means of screws 423.

The functional component bottom part 403 enables unlimited stacking of the functional component upper parts 405. All in all, the functional component bottom part achieves a repeatable combination of electric plug connection and mechanical housing assembly.

The component locations can be used as conventional star distribution end devices by employing a simple feed-in or as an energy distribution network by employing a connector and distributor module (AV module) to subscribers or nodes. Switching and protective elements, motor switches, bus couplers, or I/Os, etc., can be arranged to the left and right of the AV module in any unrestricted, functionally determined order. Doing so achieves engineering advantages based on the visible separating of low and extra-low voltage components. Multiple remote locations can span a network as a subscriber in any structure such as e.g. linear, tree or ring.

The configured range of energy distribution output no longer requires a central control cabinet. By suitably configuring the accompanying data bus, the order and positions of the remote location's individual components can be checked prior to putting the design-conformant arrangement into operation (remote putting into service, remote service).

The component assembly system 100 enables an assembly of "smart" installation networks for direct and alternating current and cabinet-free distribution in applicable system layouts. The component assembly system can be used in installation or energy distribution fields of application. In distributed automation, an assembly of modular remote locations as functional nodes in "smart" installation networks is possible. In alternative control cabinet concepts, an assembly of modular units in a control cabinet without conductor rails and without control wiring is possible with identical design for IP20 . . . IP6x.

The component assembly system 100 enables the development of remote modular motor switches of high protection class. The component assembly system 100 additionally develops a comprehensively integrated system concept (power & drive, P&D) which solves the task of advantageous remote energy distribution and supply, e.g. external of a control cabinet.

The modularity of the component assembly system 100 enables the expansion of the application beyond the modular remote location to "smart" energy distribution through to an alternative control cabinet design. Covering the spectrum of stand-alone functional components as end devices in a conventional star-shaped energy distribution can additionally be achieved. The component assembly system 100 enables a flexible remote assembly of modular systems (IP6x) and within or external of a control cabinet on standard supporting profiled rails (IP20). In a pre-assembly case, pre-wiring can be performed on an assembly block.

All of the features defined and depicted in conjunction with individual embodiments of the invention can be provided in various combinations in the inventive object in order to realize their advantageous effects simultaneously.

The protective scope of the present invention is yielded by the claims and is not limited by the features defined in the description or depicted in the figures.

LIST OF REFERENCE NUMERALS

100 component assembly system
103 terminal block
105 dovetail section
107 grounding terminals
200 supporting profiled rail
203 edge
300 bridging module
300-1 bridging module
300-2 bridging module
301 module locking device
303 receiving groove
305 bridging plug
307 rail slot
309 latching lug
311 latching section
313 recess
315 pocket
317 centering section
319 dovetail slot
321 connector section
323 seating section
325 bridging plug
327 seal
329 plug contact
331 functional component bottom part
333 functional component upper part
400 functional component
401 component securing device
403 functional component bottom part
405 functional component upper part
407 sealing element
409 connector plug section
411 notch
413 operational section
415 contact block
417 cover
419 sealing element
421 screw
421-1 functional component upper part
421-2 functional component bottom part
425 housing section
500 floating-bearing terminal bridging module
600 fixed-bearing grounding module

The invention claimed is:

1. A modular component assembly system comprising a supporting profiled rail and at least one bridging module for electrically connecting at least one functional component, wherein the bridging module comprises a module locking device for latching the bridging module onto the supporting profiled rail, wherein the bridging module comprises a protruding centering section for centering the bridging module on the supporting profiled rail, and wherein the module locking device is formed by an elastic latching section, which is arranged on each side of the bridging module, and wherein a latching lug is situated at the end of the latching section and engages behind the supporting profiled rail after the bridging module is seated.

2. The component assembly system according to claim 1, wherein the bridging module comprises a receiving groove for the insertion of an operational section of the functional component in order to absorb tensile forces of the functional component along the supporting profiled rail.

3. The component assembly system according to claim 1, wherein the module locking device comprises a rigid seating section extending around the supporting profiled rail and an elastically flexible latching section opposite the rigid seating section for locking onto the supporting profiled rail.

4. The component assembly system according to claim 1, wherein the bridging module comprises a locking device for non-displaceably locking the bridging module to the supporting profiled rail.

5. The component assembly system according to claim 1, wherein the functional component includes a functional component bottom part able to be set onto the bridging module and a functional component upper part able to be set onto the functional component bottom part, and wherein the component assembly system is laterally extended by a second functional component via the bridging module.

6. The component assembly system according to claim 5, wherein the functional component upper part forms a connection interface for the functional component bottom part and a further connection interface for a further functional component upper part attachable onto the functional component upper part.

7. The component assembly system according to claim 5, wherein the functional component bottom part comprises a component securing device for holding the functional component on the supporting profiled rail.

8. The component assembly system according to claim 1, wherein at least one of the bridging module and the functional component is displaceable on or along the supporting profiled rail.

9. The component assembly system according to claim 5, wherein the functional component bottom part and the bridging module are connectable in a form-fit connection to absorb the tensile forces acting on the connection between the bridging module and the functional component bottom part along the supporting profiled rail.

10. The component assembly system according to claim 1, comprising a terminal block for fixing the bridging module against displaceability on the supporting profiled rail, wherein the terminal block is connectable to the bridging module.

11. The component assembly system according to claim 10, wherein the terminal block is laterally fixed the bridging module via a dovetail slot incorporated in the bridging module.

12. The component assembly system according to claim 10, wherein the terminal block is at least one of a friction-lock and form-lock connectable to the bridging module.

13. The component assembly system according to claim 10, wherein the terminal block is configured to at least one of positively engage around and frictionally clamp the supporting profiled rail.

14. The component assembly system according to claim 10, wherein the terminal block has an externally conducting grounding terminal which is electroconductively connectable to the supporting profiled rail.

15. The component assembly system according to claim 10, wherein terminal block is connectable to the bridging module by at least one of a T-slot/groove connection, a dovetail connection, a screwed connection and a clamped connection.

\* \* \* \* \*